United States Patent
Coolbaugh et al.

(10) Patent No.: US 6,891,251 B2
(45) Date of Patent: May 10, 2005

(54) VARACTORS FOR CMOS AND BiCMOS TECHNOLOGIES

(75) Inventors: Douglas D. Coolbaugh, Essex Junction, VT (US); James S. Dunn, Jericho, VT (US); Michael D. Gordon, Essex Junction, VT (US); Mohammed Y. Hammad, Colchester, VT (US); Jeffrey B. Johnson, Essex Junction, VT (US); David C. Sheridan, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 211 days.

(21) Appl. No.: 10/323,022

(22) Filed: Dec. 18, 2002

(65) Prior Publication Data

US 2003/0122128 A1 Jul. 3, 2003

Related U.S. Application Data

(62) Division of application No. 10/016,539, filed on Dec. 13, 2001, now Pat. No. 6,521,506.

(51) Int. Cl.$^7$ ............................................. H01L 29/93
(52) U.S. Cl. ........................................ 257/595; 257/313
(58) Field of Search ............................ 257/296, 312, 257/313, 595, 596, 597, 598, 599, 600, 601, 602

(56) References Cited

U.S. PATENT DOCUMENTS

| | | | |
|---|---|---|---|
| 3,636,420 A | 1/1972 | Vendelin et al. | |
| 3,638,300 A | 2/1972 | Foxhall et al. | |
| 3,909,305 A | 9/1975 | Boroffka et al. | |
| 4,021,844 A | 5/1977 | Gilles et al. | |
| 4,226,648 A | 10/1980 | Goodwin et al. | |
| 4,249,262 A | 2/1981 | Fenk | |
| 4,438,445 A | 3/1984 | Colquhoun et al. | |
| 4,827,319 A | 5/1989 | Pavlidis et al. | |
| 4,973,922 A | 11/1990 | Embree et al. | |
| 5,014,018 A | 5/1991 | Rodwell et al. | |
| 5,121,067 A | 6/1992 | Marsland | |
| 5,256,996 A | 10/1993 | Marsland et al. | |
| 5,557,140 A | 9/1996 | Nguyen et al. | |
| 5,965,912 A | 10/1999 | Stolfa et al. | |
| 6,060,962 A | 5/2000 | Sokolov et al. | |
| 6,100,770 A | 8/2000 | Litwin et al. | |
| 6,211,745 B1 | 4/2001 | Mucke et al. | |

OTHER PUBLICATIONS

Joachim N. Burghartz, et al. "Integrated RF and Microwave Components in BiCMOS Technology." IEEE Transactions on Electron Devices, vol. 43, No. 9, Sep. 1996 (pp. 1559–1570).

R.A. Moline, et al., "Ion–Implanted Hyperabrupt Junction Voltage Variable Capacitors." IEEE Transactions on Electron Devices, vol. ED–19, No. 2, Feb. 1972 (pp. 267–273).

*Primary Examiner*—Hoai Pham
*Assistant Examiner*—Dana Farahani
(74) *Attorney, Agent, or Firm*—Scully, Scott, Murphy & Presser; William D. Sabo, Esq.

(57) ABSTRACT

Varactors are provided which have a high tunability and/or a high quality factor associated therewith as well as methods for fabricating the same. One type of varactor disclosed is a quasi hyper-abrupt base-collector junction varactor which includes a substrate having a collector region of a first conductivity type atop a subcollector region, the collector region having a plurality of isolation regions present therein; reach-through implant regions located between at least a pair of the isolation regions; a SiGe layer atop a portion of the substrate not containing a reach-through implant region, the SiGe layer having an extrinsic base region of a second conductivity type which is different from the first conductivity type; and an antimony implant region located between the extrinsic base region and the subcollector region. Another type of varactor disclosed is an MOS varactor which includes at least a poly gate region and a well region wherein the poly gate region and the well region have opposite polarities.

8 Claims, 4 Drawing Sheets

VARACTORS FOR CMOS AND BICMOS TECHNOLOGIES

RELATED APPLICATIONS

This application is a divisional of U.S. application Ser. No. 10/016,539, filed Dec. 13, 2001, now U.S. Pat. No. 6,521,506.

FIELD OF THE INVENTION

The present invention relates to complementary metal oxide semiconductor (CMOS) and bipolar/CMOS (BiCMOS) devices which include a varactor that has improved tunability associated therewith as well as processes for fabricating such devices. The inventive electronic devices, which include the varactor, are highly suitable for use in mobile or cellular phones, personnel digital assistances (PDAs) and other high RF (radio frequency) electronic devices.

BACKGROUND OF THE INVENTION

Varactors are electronic devices which have a capacitance that is controlled by a suitable voltage or current bias. Varactors are typically employed, for example, in so-called voltage controlled oscillators (VCOs) where a frequency of an oscillator is controlled by an applied current or voltage. In such instances, the VCOs are used when a variable frequency is required, or when a signal needs to be synchronized to a reference signal.

In radio communication devices such as mobile/cellular phones, VCOs are typically employed in phase locked loop circuits to generate suitable signals including: generation of a reference signal that is synchronized with a signal received by a radio receiver; modulation/demodulation operations and frequency synthesis.

Numerous varactors have been developed and are successfully employed in integrated circuit technologies. For example, it is known to employ pn-diodes, Schottky diodes or MOS-diodes as a varactor in bipolar, CMOS and BiCMOS technologies. In the article to R. A. Moline, et al., entitled "Ion-Implanted Hyperabrupt Junction Voltage Variable Capacitors" IEEE Trans. Electron. Device, ED-19, pp267f, 1972, varactors comprising pn-diodes are described. U.S. Pat. No. 3,638,300 to Foxhall, et al.; U.S. Pat. No. 4,226,648 to Goodwin, et al.; U.S. Pat. No. 4,827,319 to Pavlidis, et al, and U.S. Pat. No. 5,557,140 to Nguyen, et al. describe other types of variable capacitor (i.e., varactor) diodes that include hyper-abrupt ion-implanted junctions. The term 'hyper-abrupt' denotes that the implant has a doping profile that is in contact with the wall of the adjacent extrinsic base region. U.S. Pat. No. 4,973,922 to Embree, et al.; U.S. Pat. No. 5,965,912 to Stolfa, et al; and U.S. Pat. No. 6,100,770 to Litwin, et al., on the other hand, describe MOS-diodes which are employed as varactors.

The integration of varactors depends on the capability of the integrated circuit technology. An overview of integrated circuit devices for high RF applications in BiCMOS technology is described, for example, in J. N. Burghartz, et al. "Integrated RF and Microwave Components in BiCMOS Technology", IEEE Trans. Electron Devices, Col. 43, pp 1559, September 1996. As is stated therein, varactors are not a part of the standard BiCMOS device set. Instead, it is proposed to employ a collector-base junction of a bipolar transistor as a varactor.

In order to use a device as a varactor, the device must satisfy one or more, preferably two or more, of the following criteria: (1) tunability must be high (on the order of about 3 or greater); (2) Quality factor, Q, must be high (on the order of about 20 or greater); and (3) the device must exhibit linearity.

Many of the known prior art varactors do not meet the above criteria. For example, traditional base-collector junction varactors rely on the NPN base-collector profile, which is not optimized for varactor tunability. In the case of hyper-abrupt base-collector junction varactors, where the doping profile of the implant is located at the "wall" of the extrinsic base region, the device lacks linearity. With traditional MOS varactors, the tunability is high; however, an even higher tunability is often required.

In view of the above-mentioned drawbacks with prior art varactors, there is a continued need for providing new and improved varactors which satisfy the above criteria and that can be integrated with CMOS and BiCMOS devices.

SUMMARY OF THE INVENTION

One object of the present invention is to provide a highly tunable varactor for use in CMOS and BiCMOS applications.

Another object of the present invention is to provide a highly tunable varactor which is also highly linear.

A yet further object of the present invention is to provide varactors which can be easily implemented in existing CMOS and BiCMOS technologies.

An even further object of the present invention is to provide methods of fabricating varactors which are highly tunable, highly linear and have the highest possible quality factor associated therewith.

These and other objects and advantages are achieved by providing either a quasi-hyper-abrupt base-collector junction varactor having an Sb (antimony) spike located between the extrinsic base and the subcollector region of a bipolar device; or alternatively, an MOS varactor having a polySi gate and a well region of opposite doping types, i.e., polarity, as well as a subcollector reach-through region to reduce well resistance.

Specifically, the quasi hyper-abrupt base-collector junction varactor of the present invention comprises:

a substrate having a collector region of a first conductivity type atop a subcollector region, said collector region has a plurality of isolation regions present therein;

reach-through implant regions located between at least a pair of said isolation regions;

a SiGe layer atop a portion of said substrate not containing a reach-through implant region, said SiGe layer having an extrinsic base region of a second conductivity type which is different from said first conductivity type; and an antimony implant region located between said extrinsic base region and said subcollector region.

The present invention also provides a method for fabricating the above-mentioned quasi hyper-abrupt base-collector junction varactor. Specifically, the quasi hyper-abrupt base-collector junction varactor is fabricated utilizing the following processing steps which comprise:

forming a subcollector region in a lower portion of a substrate;

forming a plurality of isolation regions in an upper portion of said substrate;

forming, in any order, a collector region of a first conductivity type and an antimony implant region in said upper portion of said substrate;

forming reach-through implant regions between at least a pair of said isolation regions; and forming an SiGe layer atop a portion of said collector region which does not include a reach-through implant region, said SiGe layer having an extrinsic base region of a second conductivity type which is different than the first conductivity type and said antimony implant region is not in contact with said extrinsic base region.

Another aspect of the present invention relates to an MOS varactor which has a well region and a poly gate region of different conductivity. Specifically, the inventive MOS varactor comprises:

a substrate having a well region of a first conductivity type atop a subcollector region, said well region has a plurality of isolation regions present therein;

reach-though implant regions located between at least a pair of isolation regions; and a poly gate region of a second conductivity type that is different from said well region atop a portion of said well region which does not include a reach-through implant region.

The present invention also provides a method for fabricating the above-mentioned MOS varactor. Specifically, the MOS varactor of the present invention is fabricated utilizing the following processing steps which comprise:

providing a substrate having a well region of a first conductivity type atop a subcollector region, said well region including a plurality of isolation regions formed in an upper region thereof and at least a pair of said isolation regions include a reach-through implant region formed therebetween; and forming a poly gate region on a portion of said well region not containing a reach-through implant region, said poly gate region is of a second conductivity type which is different from said first conductivity type.

DETAILED DESCRIPTION OF THE INVENTION

Figure 1:
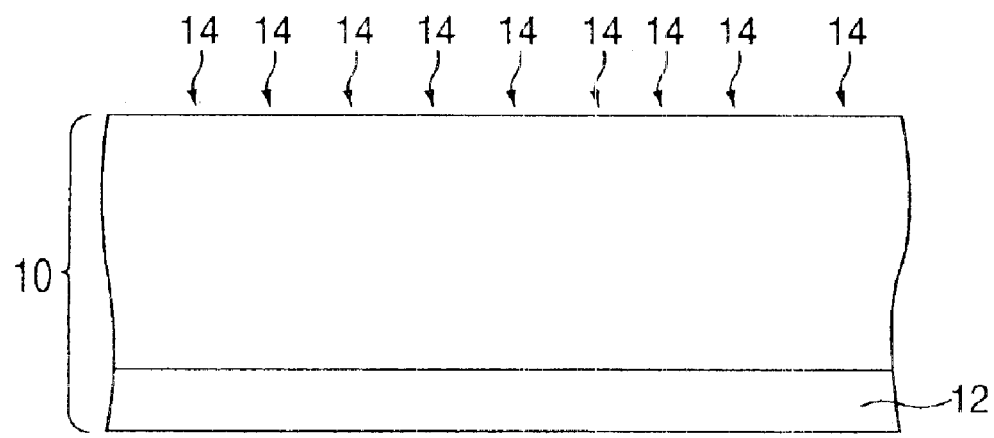
FIGS. 1–5 are pictorial representations (through cross-sectional views) showing the basic processing steps employed in fabricating a quasi hyper-abrupt base-collector junction varactor of the present invention.

The present invention, which provides novel varactors for CMOS and BiCMOS technologies as well as methods for fabricating the same, will now be described in more detail by referring to the drawings that accompany the present application.

Reference is first made to the embodiment illustrated in FIGS. 1–5 wherein the various processing steps employed in fabricating the inventive quasi hyper-abrupt base-collector junction varactor are shown. FIG. 1 illustrates the first step used in forming the inventive quasi hyper-abrupt base-collector junction varactor. Specifically, FIG. 1 shows the formation of subcollector region 12 in a lower portion of substrate 10. The term "substrate" is used herein to denote any semiconductor substrate such as Si, Ge, SiGe, GaAs, InAs, InP, and layered semiconductors such as Si/Si, Si/SiGe and silicon-on-insulators (SOIs). A preferred substrate employed in the present invention is a Si substrate.

Subcollector region 12 is formed by implanting dopant (n+ or p+, preferably n+) ions 14 into substrate 10 using a conventional implantation process and conditions well known to those skilled in the art. One possible dopant that may be utilized at this point of the present invention is As which can be implanted at a doping dosage of about 1.4E16 atoms/cm$^2$ and at an energy of about 40 keV. Other dopant ions and implant conditions besides the above-mentioned can also be employed in the present invention. In a highly preferred embodiment of the present invention, subcollector region 12 is n+ doped.

After forming the subcollector region in substrate 10, an optional epi Si layer, not shown, is formed atop the surface of substrate 10 utilizing a conventional epitaxial growing process well known to those skilled in the art.

Figure 2:
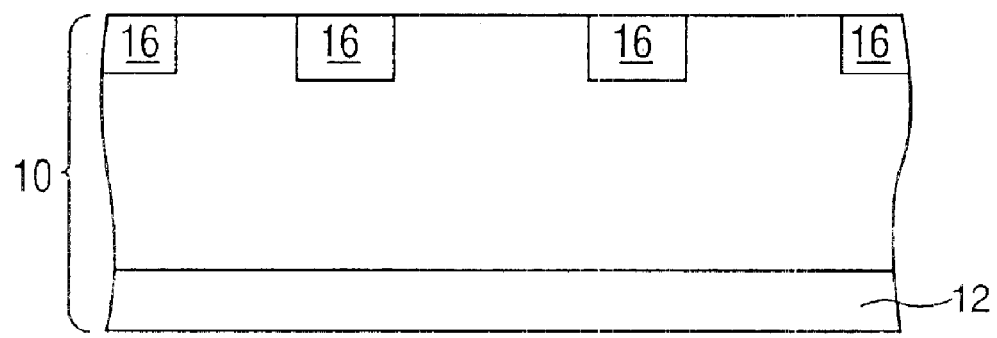

Next, and as shown in FIG. 2, a plurality of isolation regions 16 are formed in an upper portion of substrate 10 (i.e., in a portion of substrate 10 that is above the previously formed subcollector region). The isolation regions formed at this point of the present invention may be local oxidation of silicon (LOCOS) isolation regions, or more preferably, isolation regions 16 are shallow trench isolation regions. The isolation regions are formed utilizing conventional processes well known to those skilled in the art. For example, when the isolation regions are comprised of LOCOS isolation regions, a conventional oxidation process may be employed in forming the same. When the isolation regions are comprised of shallow trench isolation (STI) regions, the STI regions are formed by conventional lithography, etching and STI fill (i.e., deposition of a trench dielectric). A conventional planarization process may follow the STI fill.

Figure 3:
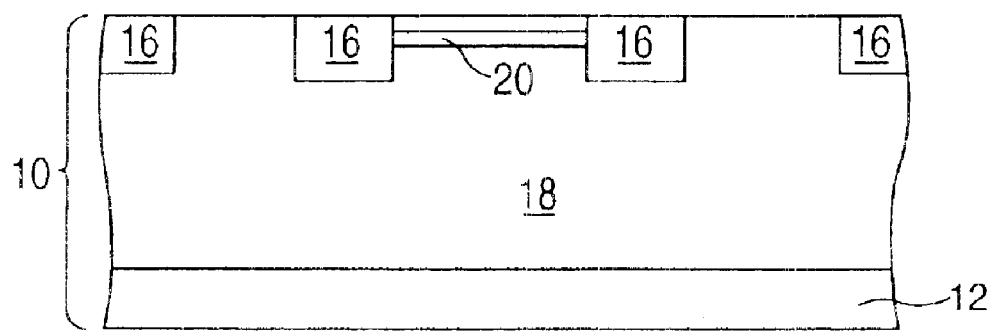
Figure 4:
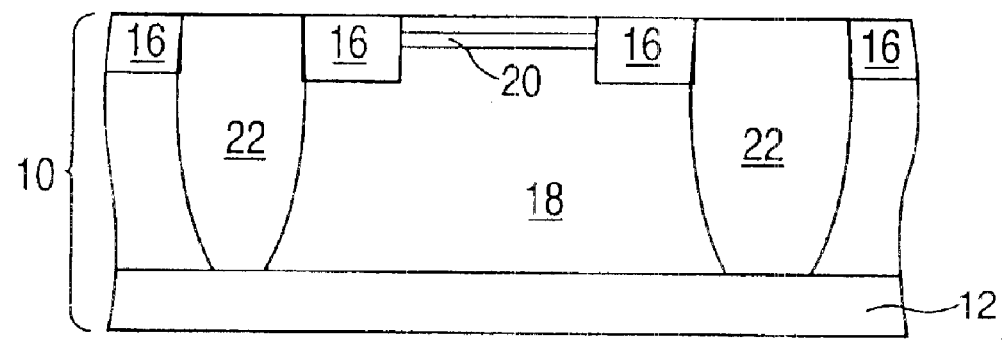

Next, and as shown in FIG. 3, various implantations are employed so as to form collector region 18 and Sb implant region 20 in the upper portion of substrate 10. The order of these implants is not critical to the present invention; therefore, it is possible to form the collector region prior to forming the Sb implant region or vice versa. Collector region 18 is formed by implanting ions of a first conductivity type (N or P) into an upper portion of substrate 10 using conventional ion implantation conditions well known to those skilled in the art. A representative implant that can be employed, for example, in forming the collector region is as follows: P ion dosage of about 6E12 atoms/cm$^2$ and an energy of about 700 keV. In a highly preferred embodiment of the present invention, collector region 18 is N doped.

The Sb implant region is formed by utilizing a low dose, low energy masked ion implantation process which is capable of forming a shallow implant profile in the structure. Specifically, the Sb implant region is formed utilizing an Sb dosage of about 5E12 atoms/cm$^2$ and at an energy of about 40 keV. It is also possible that the Sb implant region 20 is formed by utilizing an ion implantation process wherein the implant energy is from about 40 to about 70 keV. The Sb implant may be carried out using a substantially vertical ion implantation process, or, more preferably, an angle implantation process wherein the tilt angle is from about 5° to about 7° is employed.

Following formation of collector region 18 and Sb implant region 20, reach-through implant regions 22, which extend from the upper surface of substrate 10 to subcollector region 12, are formed between at least a pair of abutting isolation regions. Note that the reach-through implant regions are not formed in areas of the substrate which include the Sb implant region. The reach-through implant regions are formed by lithography, etching and ion implantation where the same dopant ion as subcollector region 12 is implanted into the substrate utilizing conventional ion implantation conditions well known to those skilled in the art. Illustrative examples of representative reach-through implant conditions that can be employed in the present invention include, but are not limited to: Sb dosage of about 1.4E14 atoms/cm$^2$ and an energy of about 200 keV or P dosage of about 4E15 atoms/cm$^2$ and an energy of about 70 keV. The resultant structure, including reach-through implant regions 22, is shown, for example, in FIG. 4.

Following formation of reach-through implant regions 22, a SiGe layer is formed on the surface of the substrate utilizing a conventional epitaxial growing process and thereafter the SiGe layer is patterned so as to form a patterned SiGe layer 24 over a portion of substrate 10 (i.e., atop collector region 18) which does not include a reach-through implant region. Note that a portion of SiGe layer may lie atop the isolation regions as well as atop collector region 18. As stated above, the SiGe layer is formed utilizing a conventional epitaxial growing process which includes, but is not limited to: ultra-high vacuum chemical vapor deposition (UHVCVD), molecular beam epitaxy (MBE), rapid thermal chemical vapor deposition (RTCVD) and plasma-enhanced chemical vapor deposition (PECVD). The conditions used in forming the SiGe layer are conventional, well known in the art and may vary depending on the desired epitaxial process used in forming the same.

It is noted that the SiGe layer includes polycrystalline SiGe regions which are predominately formed atop the isolation regions as well as single crystalline SiGe regions which are formed atop the surface of exposed substrate 10. For clarity, these regions are not shown in the drawings but are meant to be included within the SiGe layer. Following formation of SiGe layer 24, extrinsic base region 26 of a second conductivity type which is different, i.e., opposite polarity, than the first conductivity type is formed in the patterned SiGe layer utilizing a conventional ion implantation process and implant conditions well known to those skilled in the art. For example, a Ge implant followed by a B implant may be employed in the present invention, when Ge is employed, a Ge dosage of about 7E14 atoms/cm$^2$ and an energy of about 140 keV is employed. When B is employed in forming the extrinsic base, the following implant conditions may be employed: dopant dosage of about 3.4E15 atoms/cm$^2$ and energy of about 30 keV. In a highly preferred embodiment of the present invention, the extrinsic base is p+ doped. The resultant structure formed after SiGe deposition, patterning, and extrinsic base formation is shown, for example, in FIG. 5.

Figure 5:
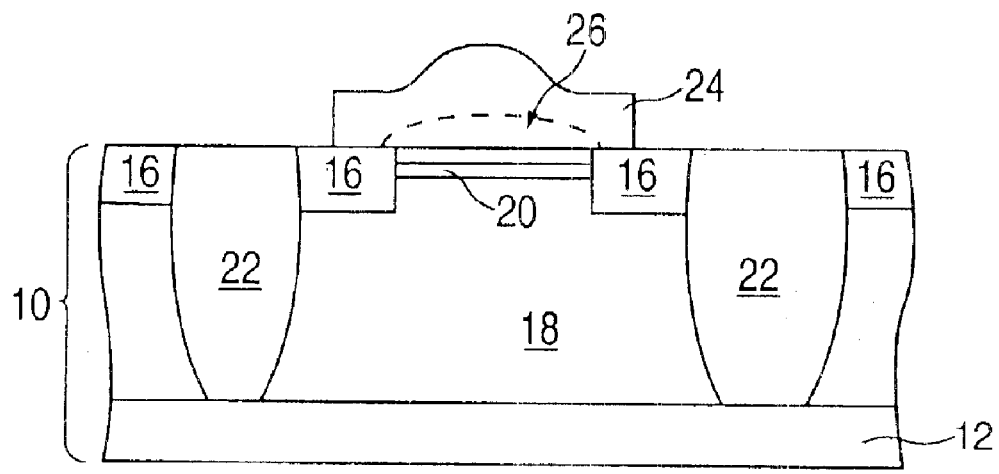

It is noted in FIG. 5, the Sb implant region has a doping profile in which the Sb implant is located between the extrinsic base region and the subcollector region. The doping profile achieved utilizing the inventive method is different from typical hyper-abrupt base-collector varactors wherein the Sb implant is formed at the wall of the extrinsic base region. The inventive profile achieves a high tunability coupled with almost ideal linearity.

Figure 6:
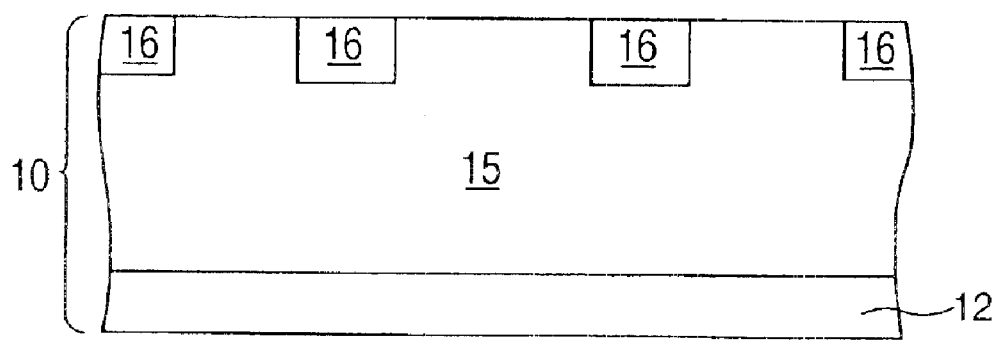
FIGS. 6–10 are pictorial representations (through cross-sectional views) showing the basic processing steps employed in fabricating a high quality MOS varactor of the present invention.

Reference is now made to the second embodiment of the present invention (which is depicted in FIGS. 6–10) wherein an MOS varactor is formed. The second embodiment begins with forming subcollector region 12 in a lower portion of substrate 10 utilizing the ion implantation conditions mentioned above in connection with forming the quasi hyper-abrupt base-collector varactor. Next, isolation regions 16 are formed in the upper portion of substrate 10 and well region 15 having a first conductivity type (preferably N-type) is ion implanted into the upper portion of the substrate 10 that lies above the subcollector region. It is noted the isolation regions are formed as described above and the well region is also formed utilizing the same ion implantation process used in forming the collector region of the quasi hyper-abrupt base-collector varactor. The resultant structure formed after performing these steps is shown in FIG. 6.

Figure 7:
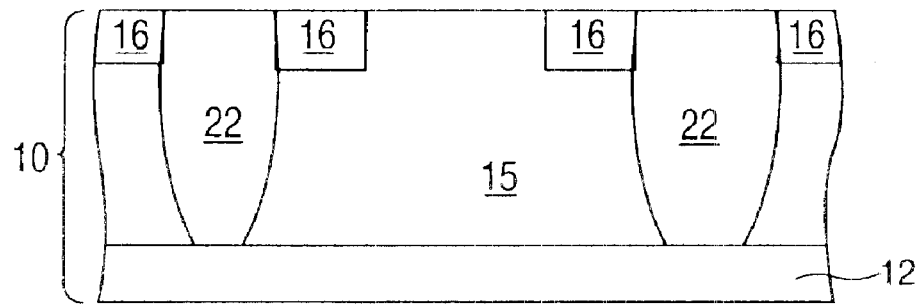

Next, reach-through implant regions 22 are formed in portions of substrate 10 utilizing the ion implantation conditions mentioned above in connection with the hyper-abrupt base-collector varactor embodiment. The resultant structure is shown in FIG. 7.

After formation of reach-through implant regions 22 in portions of the well region, poly gate region 50, which has opposite dopant polarity than the well region, is formed utilizing conventional processing techniques that are employed in forming an MOS structure. It is noted that the term "poly gate region" is used herein to denote a gate dielectric as well as a polySi gate conductor which is formed atop the gate dielectric. The poly gate region is fabricated by first forming gate dielectric 52, such as an oxide, nitride, oxynitride or any combination thereof including a stack of two or more gate dielectrics, atop the surface of substrate 10. Gate dielectric 52 is formed by a conventional deposition process such as CVD, plasma-assisted CVD, or chemical solution deposition, or alternatively, the gate dielectric may be formed by a conventional thermal oxidation, nitridation or oxynitridation process. Following the formation of gate dielectric 52, a layer of polySi 54 is formed atop the surface of the gate dielectric utilizing a conventional deposition process. Next, the gate dielectric and polySi layer are patterned by lithography and etching providing the structure shown, for example, in FIG. 8.

Figure 8:
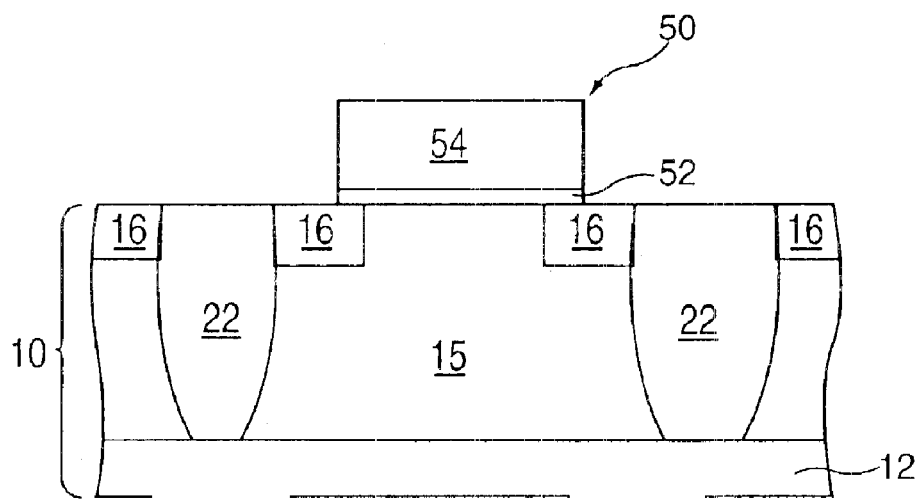
Figure 9:
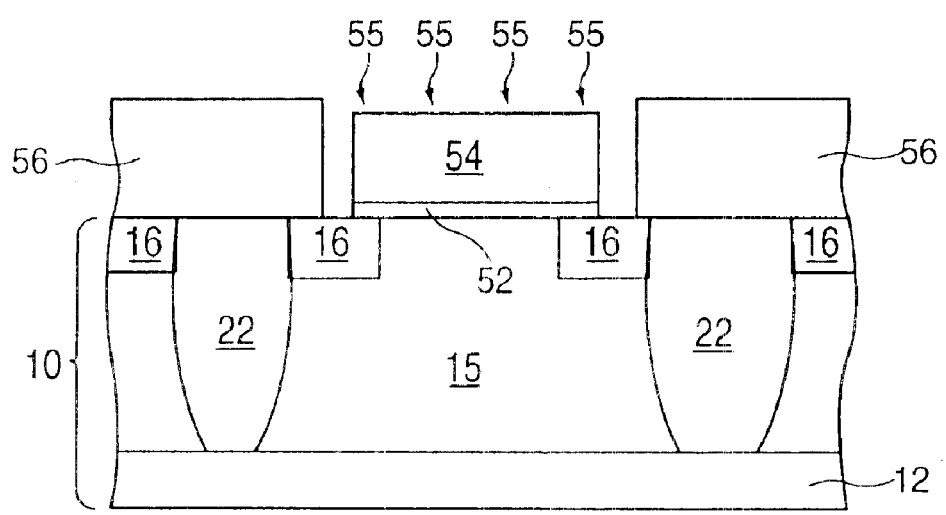

After patterning of the poly gate region, photoresist mask 56 is formed utilizing a conventional deposition process over selective portions of the structure shown in FIG. 8 so as to block portions of the structure that do not include the poly gate region. The structure including the photoresist mask is shown in FIG. 9. Next, ions of a second conductivity type 55 which are different from the first conductivity are implanted into the polySi layer of the structure utilizing conventional ion implantation conditions well known to those skilled in the art. Examples of representative conditions that can be employed in doping the polySi layer include, but are not limited to: Ge: ion dose of about 5E14 atoms/cm$^2$, energy of about 40 keV; and B: ion dose of about 3.5E15 atoms/cm$^2$, energy of about 10 keV. In a preferred embodiment, the polySi layer of the poly gate region is doped p+.

Figure 10:
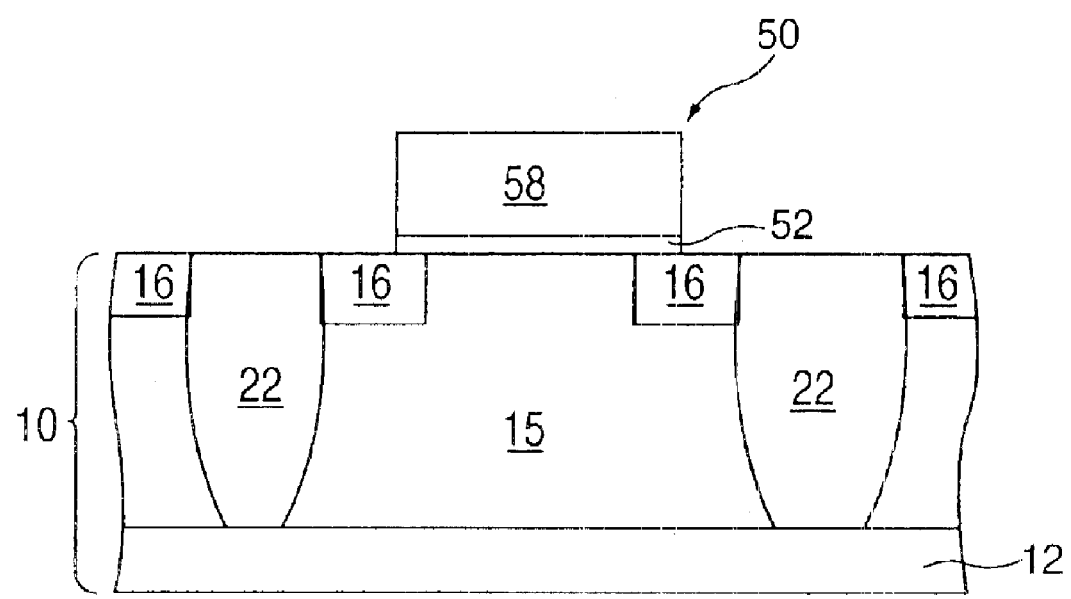

Following doping of the polySi gate layer, photoresist 56 is removed from the structure utilizing a conventional stripping process well known in the art so as to provide the MOS varactor structure shown in FIG. 10. In FIG. 10, reference numeral 58 denotes the doped polySi layer.

In a conventional CMOS process, it is impossible to build a MOS varactor where the gate has an opposite doping type to the underlying well region. The inventive device utilizes the reach-through regions to build a MOS varactor where the gate and the well region are opposite dopant type. The opposite polarity of the gate and well region results in a much higher tunability at the expense of series resistance. As mentioned previously, however, the inventive device controls series resistance by utilizing the reach-through/subcollector feature.

While this invention has been particularly shown and described with respect to preferred embodiments thereof, it will be understood by those skilled in the art that the foregoing and other changes in form and detail may be made without departing from the spirit and scope of the present invention. It is therefore intended that the present invention is not limited to the exact forms and details described and illustrated, but fall within the spirit and scope of the appended claims.

Having thus described our invention in detail, what we claim as new and secure by the Letters Patent is:

1. An MOS varactor comprising:
    a substrate having a well region of a first conductivity type atop a subcollector region, said well region has a plurality of isolation regions present therein;
    reach-though implant regions located between at least a pair of isolation regions; and
    a poly gate region of a second conductivity type that is different from said well region atop a portion of said well region which does not include a reach-through implant region.

2. The MOS varactor of claim 1 wherein said subcollector is n+ doped, said well region is N doped, said reach-through implant regions are n+ doped and said poly gate region is p+ doped.

3. The MOS varactor of claim 1 wherein said poly gate region includes a gate dielectric and a polySi layer formed atop said gate dielectric.

4. The MOS varactor of claim 1 wherein said substrate is a Si substrate.

5. The MOS varactor of claim 1 wherein said isolation regions are shallow trench isolation regions.

6. The MOS varactor of claim 3 wherein said gate dielectric is an oxide, nitride, oxynitride or any combination thereof.

7. The MOS varactor of claim 3 wherein said polySi layers includes Ge ions.

8. The MOS varactor of claim 3 wherein said polySi layer includes B ions.

* * * * *